United States Patent
Ernst et al.

(10) Patent No.: US 6,618,305 B2
(45) Date of Patent: Sep. 9, 2003

(54) TEST CIRCUIT FOR TESTING A CIRCUIT

(75) Inventors: Wolfgang Ernst, Munich (DE); Gunnar Krause, Munich (DE); Peter Poechmueller, Colchester, VT (US); Justus Kuhn, Munich (DE); Jens Luepke, Munich (DE); Jochen Mueller, Munich (DE); Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/137,125

(22) Filed: May 2, 2002

(65) Prior Publication Data

US 2002/0196688 A1 Dec. 26, 2002

(30) Foreign Application Priority Data

May 2, 2001 (DE) .......................... 101 21 309

(51) Int. Cl.[7] ................................. G11C 7/00
(52) U.S. Cl. ................. 365/201; 365/189.07
(58) Field of Search ............. 365/201, 189.07, 365/194; 714/734, 718

(56) References Cited

U.S. PATENT DOCUMENTS

| | | | | |
|---|---|---|---|---|
| 5,777,932 A | * | 7/1998 | Chonan ....................... | 365/201 |
| 5,930,271 A | * | 7/1999 | Takahashi .................... | 714/738 |
| 6,038,181 A | * | 3/2000 | Braceras et al. ............. | 365/201 |
| 6,058,056 A | | 5/2000 | Beffa et al. .................. | 365/201 |
| 6,327,199 B1 | * | 12/2001 | Fister .......................... | 365/201 |

* cited by examiner

Primary Examiner—Anh Phung
(74) Attorney, Agent, or Firm—Withrow & Terranova, PLLC

(57) ABSTRACT

Test circuit for testing a circuit to be tested, having a test data generator, which generates test data in a manner dependent on data control signals which are received via data control lines from an external test unit, a data output driver for outputting the generated test data via data line pairs of a differential data bus to the circuit to be tested, a data input circuit for receiving data that are read from the circuit to be tested and transmitted via the data line pairs of the differential data bus, a data comparison circuit, which compares the generated data and the read-out data and, in a manner depend at on the comparison result transmits an indication signal, which indicates whether the circuit to be tested is functional, to the external test unit via an indication signal line.

9 Claims, 4 Drawing Sheets

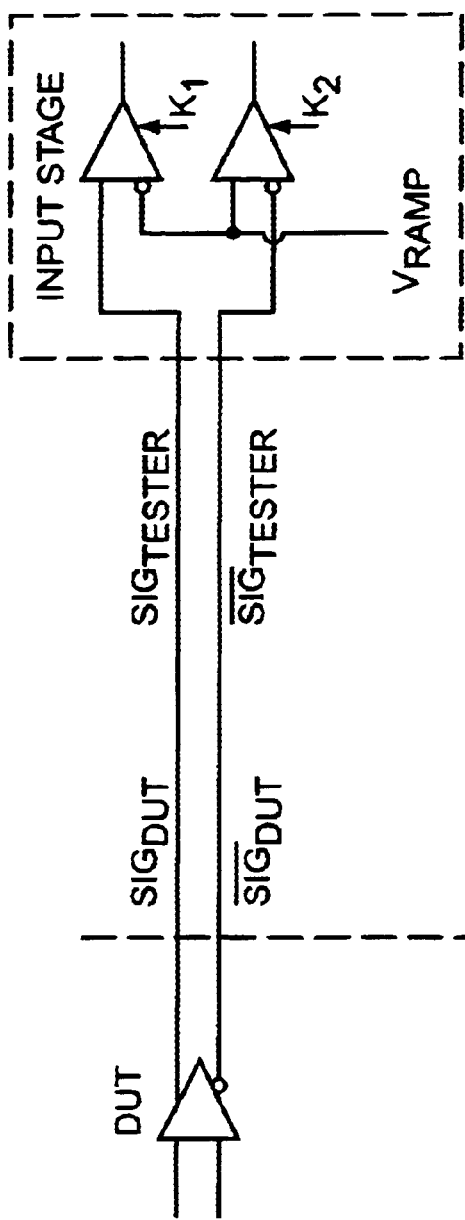
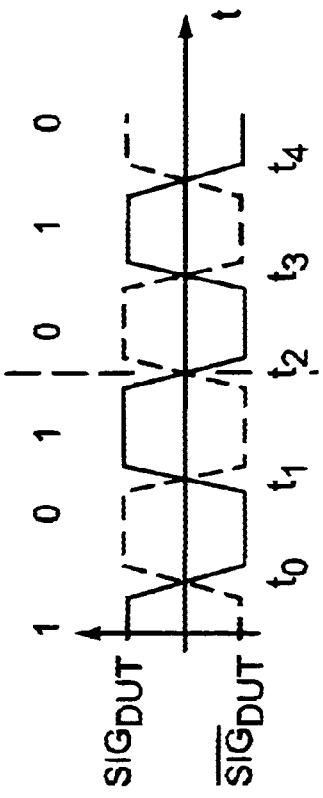
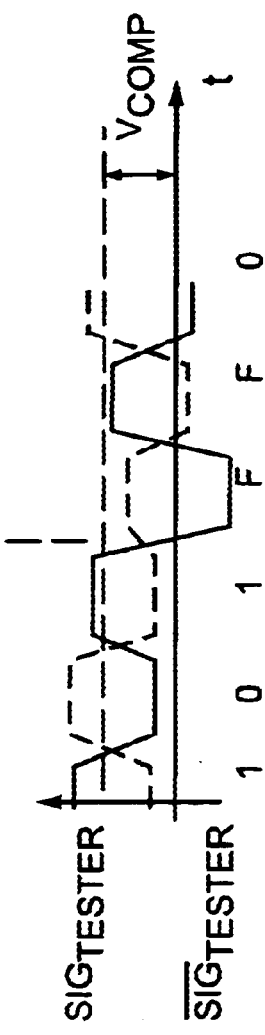
FIG. 3A PRIOR ART
FIG. 3B PRIOR ART
FIG. 3C PRIOR ART

TEST CIRCUIT FOR TESTING A CIRCUIT

This application claims the benefit of German application number 101 21 309.3, filed May 2, 2001, currently pending, the disclosure of which is incorporated herein by reference in its entirety.

FIELD OF THE INVENTION

The invention relates to a test circuit for testing a circuit to be tested, in particular a test circuit for testing a synchronous memory operating at a high frequency.

BACKGROUND OF THE INVENTION

FIG. 1a shows a test arrangement according to the prior art. A circuit to be tested (DUT: Device Under Test) is tested in respect of its functionality by an external test unit. The circuit to be tested is, for example, a synchronous memory module containing a multiplicity of memory cells. The external test unit applies control signals for testing the synchronous memory module via a control bus and addresses the memory cells to be tested within the memory module via the address bus. A test data generator contained in the external test unit generates test data patterns which, in a writing operating mode, are applied via a data bus to the circuit to be tested and are written to the addressed memory cells. Afterward, in a reading operating mode, the data are read out again from the addressed memory cells and transmitted back to the external test unit via the data bus. The test unit compares the read-out test data internally with reference test data and identifies defective memory cells on the basis of discrepancies between the reference test data and the read-out data.

In order to increase the maximum possible data transmission rate in the case of point-to-point data connections, the signal lines of the data bus, which comprises d data signal lines, for example, are designed as differential signal lines. In this case, for each data signal, in parallel the corresponding inverted data signal is passed via a dedicated signal line.

FIG. 1b shows an example of a data line pair of the data bus between the circuit to be tested DUT and the external test unit. The data line pair of the differential data bus has a first data signal line for the transmission of a data signal sig and a second data signal line for the transmission of a data signal $\overline{\text{sig}}$ inverted with respect thereto. The two illustrated data signal lines of the data line pair between the circuit to be tested DUT and the test unit have a length L.

The differential signal transmission makes it possible for the input and output stages of the circuit to be tested DUT and of the test unit to be constructed simply in terms of line technology, at the same time the input and output stages and also the transmission link being insensitive to jitter of the signal edges and drifts of the DC voltage levels.

The relatively long data signal lines between the test unit and the circuit to be tested DUT give rise to signal propagation time delays of the data signals and to signal propagation time differences between the transmitted data signal and the transmitted inverted data signal with respect thereto. The propagation time differences are a consequence of different line lengths of the two data lines of a data line pair, different parasitic capacitances or inductances and different manufacturing tolerances. Since, in the case of the test arrangement illustrated in FIG. 1b, signal propagation time differences between the data signal and the data signal transmitted in inverted form with respect thereto cannot be calibrated out, these signal propagation time differences lead to losses in the temporal accuracy of the entire test arrangement and thus to yield losses during testing. The additional inaccuracy effected by the signal propagation time differences is in excess of 50 pico seconds in many cases. When testing high-frequency memory modules which operate with clock frequencies of a few hundred megahertz, such signal propagation time delays cause test errors.

Therefore, the test arrangement illustrated in FIG. 2 was proposed. In order to compensate for the signal propagation time differences brought about by the data signal lines, in some instances having a length measured in meters, the connections and also the terminal electronics, in the test arrangement illustrated in FIG. 2 the evaluation instants of an input stage are set by a calibration circuit KAL integrated in the test unit. The input stage contains differential amplifiers which compare the received data signals with a static comparator voltage $V_{com}$, generated by a comparator voltage generator KONP.

The disadvantage of the test arrangement according to the prior art as shown in FIG. 2 is that it is highly susceptible to the timing jitter and to DC or DC voltage level drifts.

FIGS. 3a to 3c show the calibrateable test arrangement according to the prior art in accordance with FIG. 2 and the associated signals for elucidating the problems occurring here.

A data signal $SIG_{DUT}$ output by the circuit to be tested DUT is received with a certain signal delay as signal $SIG_{tester}$ by the input stage of the external test unit and is compared with a comparator voltage $V_{comp}$ by a differential amplifier. In the same way, the circuit to be tested DUT outputs an inverted data signal $\overline{SIG}_{DUT}$, which is received as inverted data signal $\overline{sig}_{tester}$ by the input stage of the external tester unit and is compared with the set comparator voltage $V_{comp}$ as threshold value by a second differential amplifier.

FIG. 3b shows, by way of example, an alternating data sequence 101010 and the associated output data signals at the output data driver of the circuit to be tested DUT.

FIG. 3c shows, by way of example, how this output data output signal is received by an input stage of the external test unit on account of a DC voltage fluctuation. If the received data signal $SIG_{tester}$ is above the comparator voltage $V_{comp}$ and, at the same time, the data signal $SIG_{tester}$ inverted with respect thereto lies below the comparator voltage, the input stage outputs a logic high datum H for further data processing. Conversely, if the received data signal is lower than the comparator voltage level and, at the same time, the inverted data signal is above the comparator voltage level, the input stage of the test unit outputs a logic zero L for further data processing.

If both the received data signal and the inverted data signal lie below the comparator DC voltage level, this is interpreted as a data transmission error F. The same applies if both the received data signal and the data signal inverted with respect thereto lie above the comparator DC voltage level.

In the example illustrated in FIG. 3c, the potential of the data signal levels is pulled down on account of a DC voltage drift, so that, from the instant $t_2$, both the received data signal sigtester and the inverted data signal $\overline{Sig}_{tester}$ with respect thereto lie below the comparator DC voltage level and, consequently, a data transmission error F is identified. A test unit with a calibrateable input stage for compensating for signal propagation time differences between the data signal lines of a data signal line pair is thus highly sensitive to potential fluctuations on the signal lines, so that test errors can occur.

The test arrangement according to the prior art as illustrated in FIG. 1 is relatively insensitive to the potential fluctuations on the data signal lines, but the signal propagation time differences between the data lines of a data line pair lead to test errors. By contrast, in the case of the test arrangement according to the prior art as illustrated in FIG. 2, said propagation time differences are compensated for by a calibration circuit, but this procedure leads to test errors on account of DC voltage level fluctuations on the data signal lines, as explained in connection with FIGS. 3a to 3c.

Therefore, the object of the present invention is to provide a test circuit for testing a circuit which avoids test errors on account of signal propagation time differences and, at the same time, is insensitive to potential fluctuations on the data signal lines.

This object is achieved according to the invention by means of a test circuit having the features specified in Patent claim 1.

SUMMARY OF THE INVENTION

The invention provides a test circuit for testing a circuit, having
a test data generator, which generates test data in a manner dependent on data control signals which are received via data control lines from an external test unit;
a data output driver for outputting the generated test data via data line pairs of a differential data bus to the circuit to be tested;
a data input circuit for receiving data that are read from the circuit to be tested and transmitted via the data line pairs of the differential data bus;
a data comparison circuit, which compares the generated test data and the read-out data and, in a manner dependent on the comparison result, transmits an indication signal, which indicates whether the circuit to be tested is functional, to the external test circuit via an indication signal line;
each data line pair of the differential data bus, between the circuit to be tested and the test circuit, having a first data signal line for the transmission of a data signal and a second data signal line for the transmission of a data signal inverted with respect thereto, and the two data signal lines being short in order to minimize signal propagation time differences between the transmitted data signal and the transmitted inverted data signal.

The test circuit according to the invention has the advantage that a calibration circuit which calibrates out the signal propagation time differences between the data signal lines is not necessary.

In a preferred embodiment of the test circuit according to the invention, said circuit contains an address generator, which generates address signals for the circuit to be tested in a manner dependent on address control signals which are received via address control lines from the external test unit.

The generated address signals are preferably transmitted from an address signal output driver of the test circuit via address line pairs of a differential address bus to an address signal input driver of the circuit to be tested.

In this case, each address line pair preferably has a first address signal line for the transmission of an address signal and a second address signal line for the transmission of an address signal inverted with respect thereto.

The two address signal lines of each address line pair are preferably designed to be short in order to minimize signal propagation time differences between the transmitted address signal and the transmitted inverted address signal.

In a preferred embodiment of the test circuit according to the invention, said test circuit contains a frequency multiplication circuit, which receives the clock frequency of a low-frequency clock signal received from the external test unit and multiplies it by a specific factor in order to generate a high-frequency clock signal for the circuit to be tested.

Furthermore, the test circuit according to the invention preferably has an internal control circuit, which generates internal control signals for driving the data input driver, the data output driver and the address signal output driver in a manner dependent on control signals which are received with a low clock frequency from the external test unit.

In a preferred embodiment, the test circuit according to the invention is integrated in the circuit to be tested. The test circuit according to the invention is preferably used for testing synchronous memories, in particular synchronous DRAM memories which operate with a very high operating clock frequency of hundreds of megahertz.

A preferred embodiment of the test circuit according to the invention is described below with reference to the accompanying drawings in order to elucidate features that are essential to the invention.

BRIEF DESCRIPTION OF THE DRAWING FIGURES

In the figures:

FIGS. 3a to 3c show diagrams for elucidating the disadvantages of the test arrangements according to the prior art as illustrated in FIG. 2;

DETAILED DESCRIPTION OF THE PREFERRED EMBODIMENTS

Figure 4:
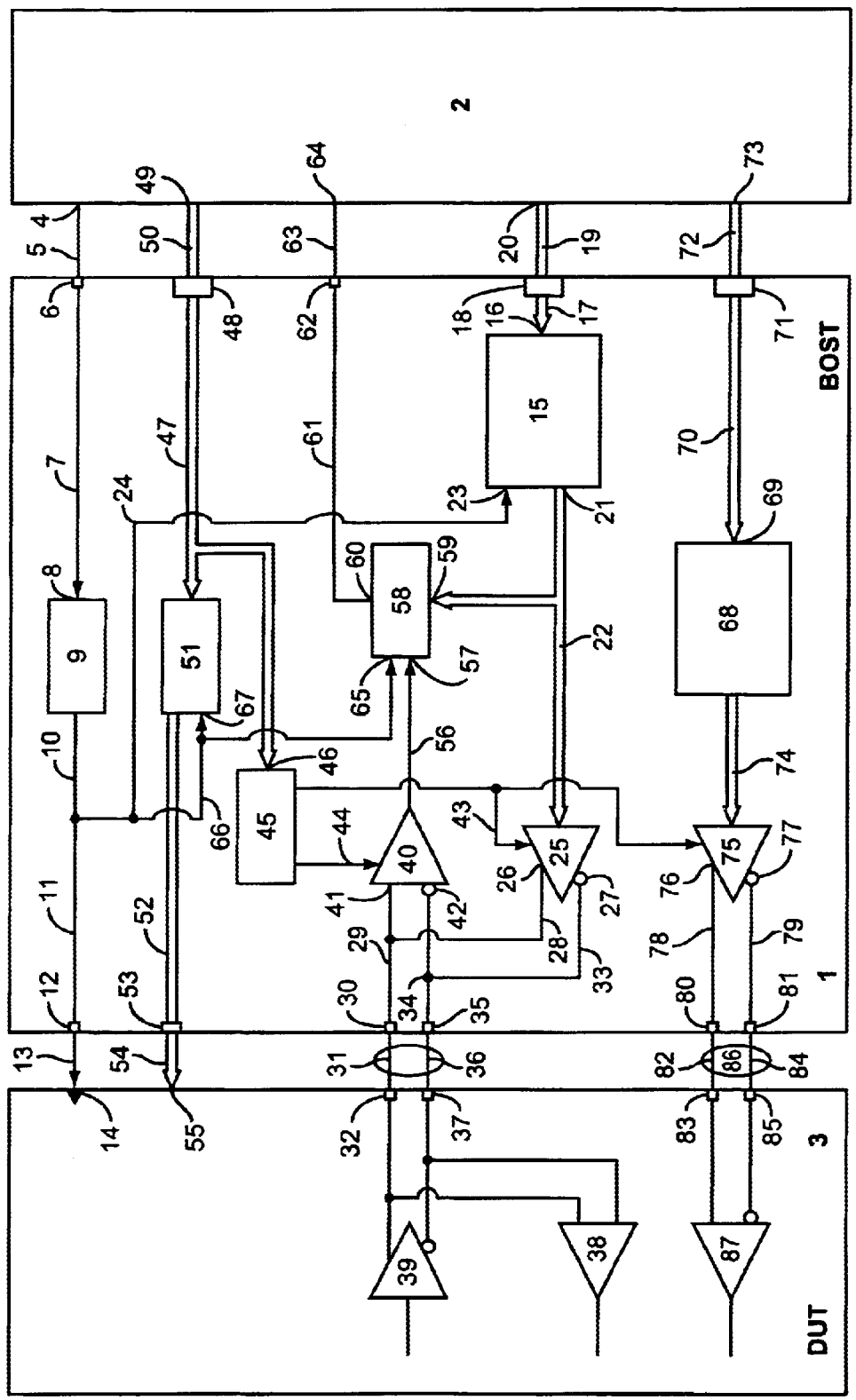
FIG. 4 shows a preferred embodiment of the test circuit according to the invention.

As can be discerned from FIG. 4, the test circuit 1 according to the invention is arranged between an external test unit 2 and a circuit 3 to be tested. The circuit 3 to be tested is, for example, a synchronous DRAM memory having a multiplicity of addressable memory cells. The external test unit 2 is a conventional test unit which operates with comparatively low clock frequencies. The test unit 2 has a clock signal output 4, which is connected to a clock input 6 of the test circuit 1 via a clock signal line 5. The clock signal input 6 of the test circuit 1 is connected to an input 8 of a frequency multiplication circuit 9 via an internal clock line 7. The frequency multiplication circuit 9 multiplies the clock frequency of the received low-frequency clock signal by a specific adjustable factor in order to generate a high-frequency differential clock signal and outputs this clock signal via an output 10 to an internal differential clock signal line 11 and a clock output 12 of the test circuit 1. The clock signal output 12 is connected via an external differential clock line 13 to a clock signal input 14 of the circuit 3 to be tested. The external test unit 2 outputs, for example, a clock signal having a clock frequency of 100 megahertz, which is increased by the frequency multiplication circuit 9 to form a clock frequency of 400 megahertz, which corresponds to the operating frequency of a synchronous memory module 3 to be tested.

The test circuit 1 furthermore contains a test data generator 15 having a control input 16, which is connected to a control input 18 of the test circuit 1 via internal data control lines 17. The control input 18 is connected to a control output 20 of the external test unit 2 via data control lines 19.

The test data generator 15 receives data control signals via the data control lines 19 from the external control unit 2 and generates test data in a manner dependent on the received data control signals and outputs these generated test data via a data output 21 to an internal differential data bus 22 of the test circuit 1. The test data generator 15 preferably receives low-frequency data control signals from the test unit 2 and generates, in a manner dependent thereon, high-frequency test data patterns which are stored in registers of the test data generator 15. These stored test data patterns are preferably written to the registers of the test data generator 15 by the external test unit 2 in an initialization operating mode with a low clock frequency. The test data generator 15 has a clock signal input 23 and is clocked with the output clock signal of the frequency multiplication circuit 9 via an internal clock line 24 for the generation of high-frequency test data patterns.

The test circuit 1 contains a data output driver 25 for outputting the test data generated by the test data generator 15 via a plurality of data line pairs of a differential data bus to the circuit 3 to be tested. The data output driver 25 comprises a multiplicity of differential amplifiers connected in parallel, FIG. 4 illustrating, by way of example, one differential amplifier for outputting a data signal. The differential amplifier of the data output driver 25 has a signal output 26 and an inverted signal output 27. The signal output 26 is connected to an internal data line 29 of the test circuit 1 via a line 28. The internal data line 29 is connected to a data terminal 30 of the test circuit 1, which is connected via an external data signal line 31 to a data terminal 32 of the circuit 3 to be tested. The inverted data output of the data output driver 25 is connected via a line 33 to an internal data line 34 of the test circuit 1, which is connected to an inverted data terminal 35 of the test circuit 1. The inverted data terminal 35 is connected via an external data signal line 36 to an associated data terminal 37 of the circuit 3 to be tested. The data signal line 31 serves for the bidirectional transmission of data signals and the second data signal line 36, which is complementary with respect thereto, serves for the bidirectional transmission of an inverted data signal with respect thereto between the test circuit 1 and the circuit 3 to be tested. The circuit 3 to be tested contains a data signal input circuit 38 for receiving test data and a differential data signal output driver 39 for outputting read-out data.

As can be discerned from FIG. 4, the test circuit 1 according to the invention contains, in addition to the data output driver 25, a data input circuit 40 for receiving data which are read differentially from the circuit 3 to be tested and are transmitted to the test circuit 1 via the data line pair 31, 36. For this purpose, the data input circuit 40 has a data input 41 and an inverted data input 42 with respect thereto. The signal delay of the data output driver 25 can be set via a setting line 43 and the signal delay of the data input circuit 40 can be set via a setting line 44 by an internal control circuit 45 of the test circuit 1. This makes it possible to set timing parameters for critical testing of the circuit 3 to be tested.

The internal controller 45 has a control input 46, which is connected to a control input 48 via an internal control signal bus 47 of the test circuit 1. The external test unit 2 has a control output 49 and is connected to the control input 48 via a control signal line bus 50. The test unit 2 outputs, via the control signal line bus 50, relatively low-frequency control signals to the test circuit 1, preferably each control signal being transmitted as a parallel signal in accordance with the frequency multiplication factor and, after parallel-serial conversion, being output as a high-frequency control signal via an internal control signal bus 52 to a control output 53 of the test circuit 1. The control output 53 of the test circuit 1 is connected via an external control signal bus 54 to a control input 55 of the circuit 3 to be tested. The low-frequency control signals output by the test unit 2 are received by the internal controller 45 of the test circuit 1 and are evaluated in order to generate internal control signals for driving internal components, such as, for example, the data signal input circuit 40 and the data output driver 25. This makes it possible to obviate additional control lines for driving internal circuits of the test circuit 1 between the external test unit 2 and the test circuit 1.

The data received by the data input circuit 40 pass via data lines 56 to a data input 57 of a data comparison circuit 58, which compares the test data which are generated by the test data generator 15 and are present at an input 59 of the data comparison circuit 58 and, in a manner dependent on the comparison result, generates an indication signal, which indicates whether or not the circuit 3 to be tested is functional. The generated indication signal is output by a signal output 60 of the data comparison circuit 58 via an internal line 61 to an output 62 of the test circuit 1 and passes via an external data line 63 to an input 64 of the external test unit 2. The data comparison circuit 58 likewise has a clock signal input 65 and receives, via an internal clock signal line 66, the high-frequency operating clock signal generated by the frequency multiplication circuit 9. The clock signal line 66 is also connected to a clock signal input 67 of the parallel-serial converter 51 for the clocking thereof.

The test circuit 1 according to the invention preferably contains an address generator 68 having an input 69, which is connected to a control input 71 of the test circuit 1 via internal address control lines 70. The control input 71 of the test circuit 1 is connected to the external test unit 2 via external address control lines 72 and an address control input 73. The address generator 68 receives control signals from the external test unit 2 via the address control lines and, in a manner dependent on said control signals, generates address signals for addressing memory cells within the circuit 3 to be tested, which is output via an internal address bus 74 to an address signal output driver 75 of the test circuit 1. The internal address bus 74 and the control signal bus 52 are embodied as differential buses or as non-differential buses. The address signal output driver 75 has an address signal output 76 and an inverted address signal output 77 with respect thereto, which are connected via internal address lines 78, 79 to an output 80, 81 of the test circuit 1. The address signal output 80 of the test circuit 1 is connected via an external address line 82 to an input 83 of the circuit 3 to be tested and the inverted address signal output 81 with respect thereto is connected via a corresponding address line 84 to an input 85 of the circuit 3 to be tested. The two complementary address lines 82, 84 form an address line pair 86 of a differential address bus which is provided between the test circuit 1 and the circuit 3 to be tested. The applied differential address signal is received by a differentially constructed address signal input circuit 87 of the circuit 3 to be tested.

In order to test a memory module 3 with a multiplicity of addressable memory cells contained therein, the test unit 2 outputs address control signals via the address control lines to the address generator 68 of the test circuit 1, which, in a manner dependent on the received address control signals, generates address signals for addressing the memory cells to be tested and outputs them via the address signal output driver 75 of the test circuit 1 to external address signal lines 82, 84. The address signal output driver 75 comprises a multiplicity of differential amplifiers connected in parallel, FIG. 4 illustrating, by way of example, one differential amplifier for outputting an address signal. The memory cells of the circuit 3 to be tested which are addressed via the address signal line pairs 86 of the address bus receive the test data which are generated by the test data generator 15 and output via the data output driver 25 and are written to the addressed memory cells in a writing mode. Afterward, the addressed memory cells are read again in a reading operating mode and forwarded to the data comparison circuit 58 by the data input circuit 40. The data comparison circuit 58 compares the reference test data fed from the data generator 15 with the read-out test data and compresses the data discrepancies ascertained in the process to form an indication datum, which indicates whether or not data errors occurred in the test data block read last. This indication datum is output to the external test unit 2 via an indication signal line 63.

Figure 1A:
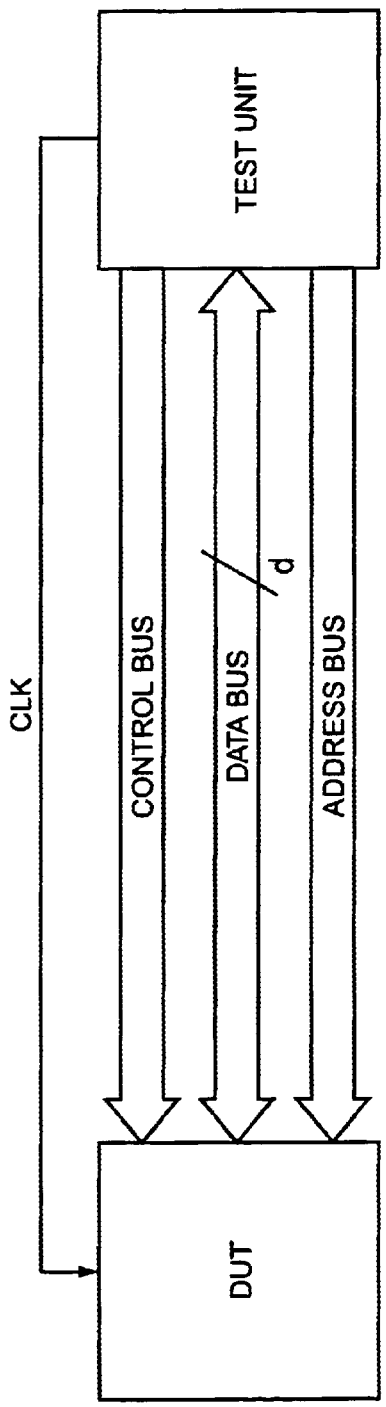
FIGS. 1a, 1b show a first test arrangement according to the prior art.
Figure 1B:
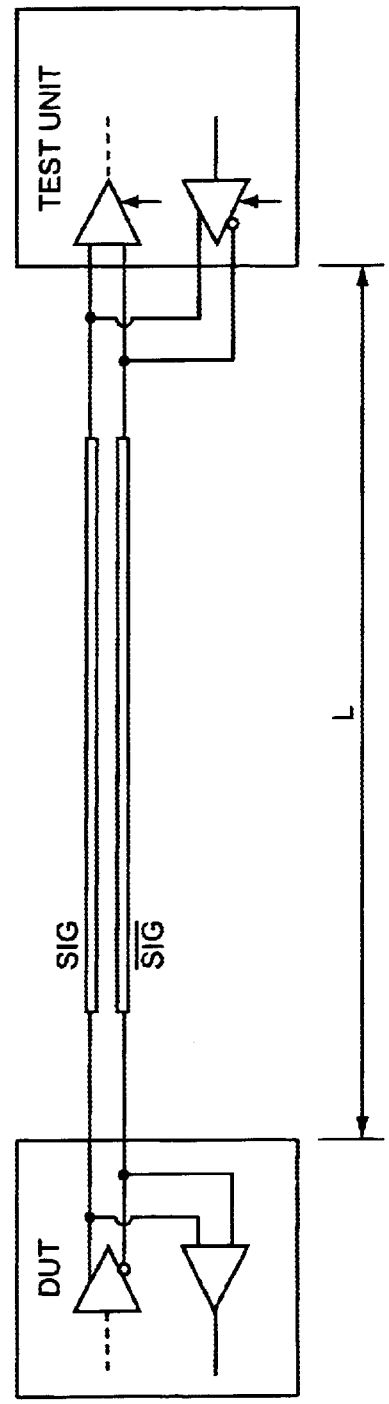
Figure 2:
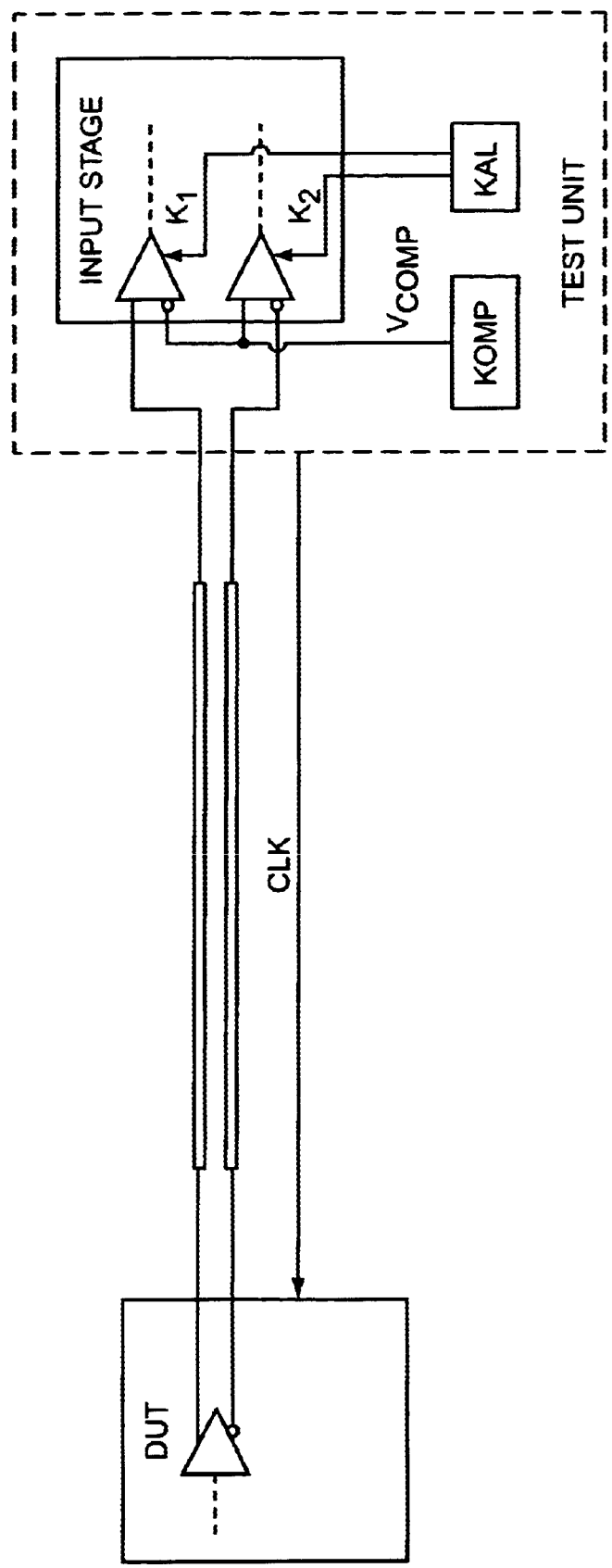
FIG. 2 shows a second test arrangement according to the prior art.

The line lengths of the data signal lines 31, 36 of the data bus between the circuit 3 to be tested and the test circuit 1 for writing test data to the circuit 3 to be tested and for reading data from the circuit 3 to be tested are very short in comparison with the data control lines 19 between the test unit 2 and the test circuit 1. As a result of this, the signal propagation time differences between a data signal which is transmitted via the data signal line 31 and a data signal which is inverted with respect thereto and is transmitted via the complementary data line 36 are minimal, so that there is no need to effect calibration within the test circuit 1. The evaluation of the incoming data signals in direct proximity to the circuit 3 to be tested thus obviates the need to calibrate out propagation time differences between the data signal and the inverse signal with respect thereto. Since a calibration circuit, as in the test arrangement according to the prior art as illustrated in FIG. 2, is not necessary, it is also the case that no test errors are brought about by potential fluctuations in the case of the data signal lines 31, 36.

The internal control circuit 45 makes it possible to test critical parameters such as, for example, setup and hold times by settings of corresponding signal delays of the data signal input driver 40 and of the data signal output driver 25.

The test circuit 1 according to the invention makes it possible to test memory modules which operate at a high frequency with differential input and output terminals precisely with relatively little additional outlay on circuitry, without propagation time differences between the data signal lines or potential fluctuations on the data signal lines leading to test errors.

| List of reference symbols |
| --- |
| 1 Test circuit |
| 2 External test unit |
| 3 Circuit to be tested |
| 4 Output |
| 5 Clock line |
| 6 Clock input |
| 7 Internal clock line |
| 8 Clock input |
| 9 Frequency multiplication circuit |
| 10 Clock output |
| 11 Internal clock line |
| 12 Clock output |
| 13 External clock line |
| 14 Clock input |
| 15 Test data generator |
| 16 Data input |

| -continued |
| --- |
| List of reference symbols |
| 17 Internal data control lines |
| 18 Data control input |
| 19 External data control lines |
| 20 Data control output |
| 21 Data output |
| 22 Internal data bus |
| 23 Clock input |
| 24 Internal clock line |
| 25 Data output driver |
| 26 Data output |
| 27 Inverse data output |
| 28 Internal data line |
| 29 Internal data line |
| 30 Data terminal |
| 31 External data signal line |
| 32 Data terminal |
| 33 Internal data line |
| 34 Internal data line |
| 35 Data terminal |
| 36 External data signal line |
| 37 Data terminal |
| 38 Input driver |
| 39 Output driver |
| 40 Data input circuit |
| 41 Data input |
| 42 Inverse data input |
| 43 Setting line |
| 44 Setting line |
| 45 Internal controller |
| 46 Control input |
| 47 Internal control lines |
| 48 Control input |
| 49 Control output |
| 50 External control signal lines |
| 51 Parallel-series converter |
| 52 Control line |
| 53 Control output |
| 54 Control bus |
| 55 Control input |
| 56 Data lines |
| 57 Data input |
| 58 Data comparison circuit |
| 59 Data input |
| 60 Signal output |
| 61 Internal indication line |
| 62 Output |
| 63 External indication line |
| 64 Input |
| 65 Main input |
| 66 Clock signal line |
| 67 Clock signal input |
| 68 Address generator |
| 69 Input |
| 70 Internal address control signal lines |
| 71 Input |
| 72 External address control signal lines |
| 73 Control output |
| 74 Lines |
| 75 Address signal output driver |
| 76 Address signal output |
| 77 Inverse address signal output |
| 78 Internal address signal line |
| 79 Internal address signal line |
| 80 Address signal output |
| 81 Inverse address signal output |
| 82 Address signal line |
| 83 Address signal input |
| 84 Inverse address signal line |
| 85 Address signal input |
| 86 Address line pair |

What is claimed is:

1. Test circuit for testing a circuit to be tested, having:

a) a test data generator, which generates reference test data in a manner dependent on data control signals which are received via data control lines from an external test unit;
b) a data output driver for outputting the generated reference test data via data line pairs of a differential data bus to the circuit to be tested;
c) a data input circuit for receiving data that are read from the circuit to be tested and transmitted via the data line pairs of the differential data bus;
d) a data comparison circuit, which compares the generated reference test data and the read-out data and, in a manner dependent on the comparison result, transmits an indication signal, which indicates whether the circuit to be tested is functional, to the external test unit via an indication signal line;
e) each data line pair of the differential data bus, between the circuit to be tested and the test circuit, having a first data signal line for the transmission of a data signal and a second data signal line for the transmission of a data signal inverted with respect thereto, and the two data signal lines being short in order to minimize signal propagation time differences between the transmitted data signal and the transmitted inverted data signal.

2. Test circuit according to claim 1, characterized in that the test circuit has an address generator, which generates address signals for the circuit to be tested in a manner dependent on address control signals which are received via address control lines from the external test unit.

3. Test circuit according to claim 2, characterized in that the generated address signals are transmitted from an address signal output driver of the test circuit via address lines of an address bus to an address signal input circuit of the circuit to be tested.

4. Test circuit according to claim 3, characterized in that the address bus is of differential design, the address line being embodied as an address line pair, each address line pair having a first address signal line for the transmission of an address signal and a second address signal line for the transmission of an address signal inverted with respect thereto.

5. Test circuit according to claim 4, characterized in that the two address signal lines of each address line pair are short in order to minimize signal propagation time differences between the transmitted address signal and the transmitted inverted address signal.

6. Test circuit according to claim 1, characterized in that the test circuit has a frequency multiplication circuit, which receives the clock frequency of a low-frequency clock signal received from the external test unit and multiplies it by a specific factor in order to generate a high-frequency clock signal for the circuit to be tested.

7. Test circuit according to claim 1, characterized in that the test circuit has an internal control circuit, which generates internal control signals for driving the data input circuit and the data output driver of the address signal output driver in a manner dependent on control signals which are received with a low clock frequency from the external test unit.

8. Test circuit according to claim 1, characterized in that a signal delay of the data signal received by the data input circuit and a signal delay of the data signal output by the data output driver can be set by the internal control circuit.

9. Test circuit according to claim 1, characterized in that the test circuit is integrated in the circuit to be tested.

* * * * *